United States Patent [19]

Hikita et al.

[11] Patent Number: 5,438,305

[45] Date of Patent: Aug. 1, 1995

[54] HIGH FREQUENCY MODULE INCLUDING A FLEXIBLE SUBSTRATE

[75] Inventors: Mitsutaka Hikita, Hachioji; Atsushi Sumioka; Takatoshi Akagi, both of Kokubunji; Toyoji Tabuchi, Kanagawa; Nobuhiko Shibagaki, Hachioji, all of Japan

[73] Assignees: Hitachi, Ltd.; Hitachi Denshi Kabushiki Kaisha, both of Tokyo; Hitachi Video & Information System, Inc., Kanagawa, all of Japan

[21] Appl. No.: 924,091

[22] Filed: Aug. 3, 1992

[30] Foreign Application Priority Data

Aug. 12, 1991 [JP] Japan .................. 3-201658

[51] Int. Cl.⁶ .................. H05K 7/02; H03H 9/64; H03H 11/28
[52] U.S. Cl. .................. 333/32; 333/033; 333/193; 333/247; 310/313 R; 257/728; 174/52.1; 174/52.4; 361/751; 361/761
[58] Field of Search ............ 333/247, 32, 33, 193–195, 333/150, 153, 154; 310/313 R, 313 B, 313 C, 313 D; 257/728; 361/749–751, 761, 764; 174/52.1, 52.4

[56] References Cited

U.S. PATENT DOCUMENTS

| | | | |
|---|---|---|---|
| 4,250,473 | 2/1981 | Gemba | 333/194 X |
| 4,298,846 | 11/1981 | Hirono et al. | 333/32 |
| 4,409,567 | 10/1983 | Setsune et al. | 333/194 X |
| 4,625,184 | 11/1986 | Niitsumo et al. | 333/32 X |
| 4,673,958 | 6/1987 | Bayraktaroglu | 333/247 X |
| 4,803,449 | 2/1989 | Hikita et al. | 333/193 |
| 5,023,624 | 6/1991 | Heckaman et al. | 333/247 X |
| 5,049,978 | 9/1991 | Bates et al. | 333/247 X |
| 5,206,712 | 4/1993 | Kornrumpf et al. | 333/247 X |

FOREIGN PATENT DOCUMENTS

| | | | |
|---|---|---|---|
| 0334747A1 | 9/1989 | European Pat. Off. . | |
| 3032847 | 3/1981 | Germany | 333/195 |
| 3323612A1 | 1/1984 | Germany . | |
| 98158 | 8/1979 | Japan | 333/154 |
| 56-129345 | 10/1981 | Japan . | |
| 230316 | 12/1984 | Japan | 333/193 |
| 120104 | 5/1989 | Japan | 333/247 |
| 156702 | 6/1990 | Japan | 333/247 |

OTHER PUBLICATIONS

Hitita, Mitsutaka, et al. "800–MHz High–Performance Saw Filter Using New Resonant Configuration," IEEE Transactions on Microwave Theory and Techniques, vol. MIT–33, No. 6, Jun. 1985, pp. 510–518.

Hikita, Mitsutaka et al., "Miniature Saw Antenna Duplexer for 800–MHz Portable Telephone Used in Cellular Rdio Systems," IEEE Transactions on Microwave Theory and Techniques, vol. 36, No. 6, Jun. 1988, pp. 1047–1056.

Ohsaki, Takaki. "Electronic Packaging in the 1990's–A Perspective from Asia," IEEE Transactions on Components, Hybrids, and Manufacturing Technology, vol. 14, No. 2, Jun. 1991, pp. 254–261.

Primary Examiner—Benny Lee
Attorney, Agent, or Firm—Fay, Sharpe, Beall, Fagan, Minnich & McKee

[57] ABSTRACT

A high frequency module is disclosed which comprises a high frequency device in a package, a circuit formed on a flexible substrate in the package, the circuit, the high frequency device and input/output terminals of the package being connected electrically.

21 Claims, 9 Drawing Sheets

HIGH FREQUENCY MODULE INCLUDING A FLEXIBLE SUBSTRATE

BACKGROUND OF THE INVENTION

The present invention relates to devices such as surface acoustic wave (SAW) devices which constitute, for example, surface acoustic wave filters or surface acoustic wave resonators, and devices which handle high frequency signals, and more particularly to a small high-performance high-frequency module suitable for use in a radio communication device such as a portable telephone set.

Figure 2A:
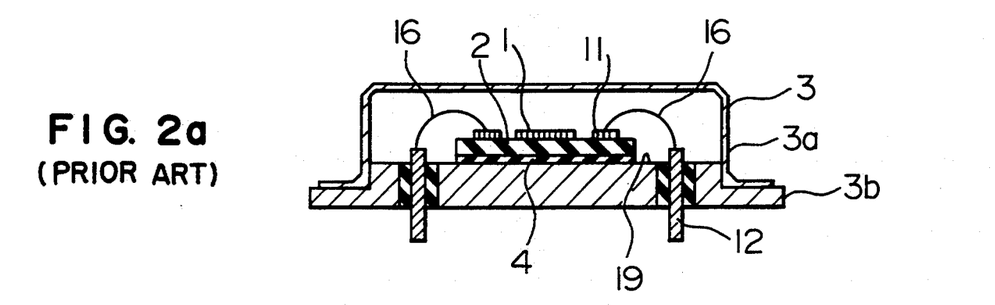

One example of the conventional packaged surface acoustic wave modules is shown in FIG. 2a. A surface acoustic wave device 2 is die-bonded within a metal package 3, hermetically sealable with a bond 4, and connected to package terminals 12 by wire bonding at 16 through bonding pads 11.

Figure 2B:
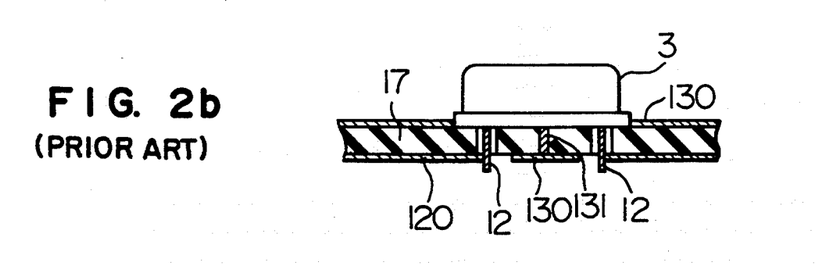
Figure 2C:
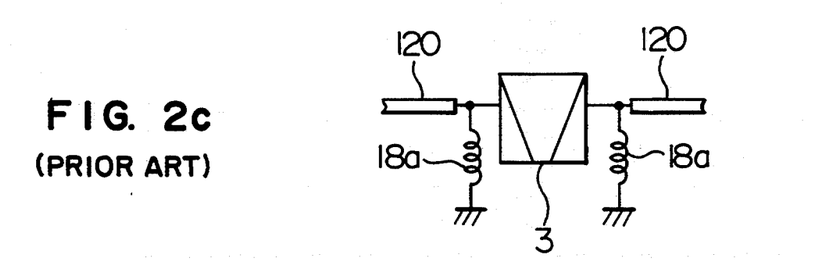
Figure 2D:
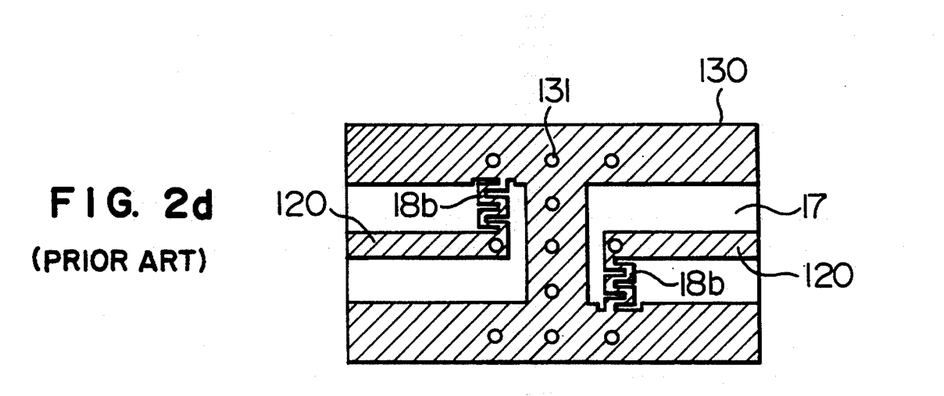

FIGS. 2b, 2c and 2d show hypothetical examples of a structure including a surface acoustic wave device package shown in FIG. 2a die-bonded to a mother board, for example, of a communication device. Generally, the impedance viewed from the input/output terminals 12 of the surface acoustic wave device is capacitative on the order of several pF because of the existence of capacitance involving the finger electrodes of a transducer 1 (FIG. 2a) which excites surface acoustic waves. Therefore, as shown in FIG. 2b, after a surface acoustic wave device package 3 is die-bonded to a mother board 17, for example, of a communication device terminal, external inductive matching circuits 18a, 18b are connected to the input/output terminals to cancel the capacitance components, as shown in FIG. 2c, 2d. Reference numeral 120 denotes input/output lines (FIGS. 2b, 2c, 2d) and 130. (FIG. 2d) denotes a ground potential layer at which a surface to which the package 3 and high frequency device 2 are attached is maintained via through holes 131 (FIG. 2d). FIG. 2d shows the opposite side of the mother board from the package 3 of FIG. 2b.

Such conventional SAW device shown in FIG. 2a is disclosed, for example, in "800-MHz HIGH-PERFORMANCE SAW FILTER USING NEW RESONANT CONFIGURATION", *IEEE Transactions on Microwave Theory and Techniques*, Vol. MTT-33, No. 6, June 1985, pp. 510–518, and "Miniature SAW Antenna Duplexer for 800-MHz Portable Telephone Used in Cellular Radio Systems", *IEEE Transactions on Microwave Theory and Techniques*, Vol. 36, No. 6, June 1988, pp. 1047–1056.

SUMMARY OF THE INVENTION

Conventionally, especially in a surface acoustic wave device, as shown in FIG. 2a, a surface acoustic wave device chip 2 is attached so as to cover an upper surface 19 of a lower metal package portion 3b, and the device 2 and the input/output terminals 12 of the package are connected with bonding wires 16. For sealing purposes, the metal cap 3a is attached and fixed as by current welding. Generally, the surface acoustic wave device has a large capacitative input/output impedance due to the existence of inter-electrode capacitance inherent essentially to an interdigital transducer 1 (IDT) which excites a surface acoustic wave. When such a surface acoustic wave device is applied, for example, to a radio communication device, the input/output terminals 12 are provided so as to extend through the mother board 17 and soldered to the back surface, as shown in FIG. 2b. In addition, in order to cancel the capacitative components of the input/output impedances of the surface acoustic wave device, as shown in FIGS. 2c and 2d, impedance matching is required using external matching circuits, for example, of coil-like inductances 18a (FIG. 2c) and meander line-like inductances 18b (FIG. 2d).

The surface acoustic wave resonator used in a voltage-controlled oscillator, etc., influences the resonant frequency because the inductance, for example, of the bonding wire is connected in series with the resonator according to the conventional die-bonding techniques. When the length of the bonding wire changes, the resonant frequency also changes. Therefore, in order to adjust a change in the resonant frequency due to the use of a different length of the wire, external coils adjustable such as those shown in FIG. 2c as separate tuning circuits are required to be used. The external matching circuit is also used to adjust and absorb changes in the input/output impedances due to different lengths of wires 16 for wire bonding as shown in FIG. 2a.

Active devices such as GaAs FETs also require an external matching circuit as is the surface acoustic wave device.

Recently, in mobile communication applications such as car telephone sets, radio terminals have been miniaturized from portable to pocketable. A microminiaturized terminal of a fountain pen type is expected to appear in the future. As such radio terminals are miniaturized, very strict requirements are imposed on the devices used. Especially, the surface acoustic wave devices are each small in itself, but they have many problems, for example, involving provision of an external matching circuit and to be solved in the course of miniaturization and non-adjustment of the entire terminal.

The surface acoustic wave devices are considered significant in the miniaturization process. However, they actually require external matching circuits, as shown in FIGS. 2c and 2d. Thus, even if a surface acoustic wave device package 3 is miniaturized satisfactorily, the merits deriving from such miniaturization are reduced by one half. Such problems also exist in an external matching circuit for a semiconductor device such as a GaAs FET.

In order to solve these problems, it is an object of the present invention to provide an attaching method of miniaturizing modules and reducing variations in the characteristic of modules in fabrication and a high frequency module which builds a matching circuit in the module and requires no adjustment.

In order to achieve the above object, according to one aspect of the present invention, there is provided a high frequency module comprising a high frequency device in a package, and either a distributed or a lumped constant circuit provided within the package such that the distributed or lumped constant circuit performs impedance matching or transformation for the high frequency device.

The high frequency device is either a surface acoustic wave device or a semiconductor device and its circuit is formed on a flexible substrate made, for example, of polyimide.

As a specified structure, the package comprises a lower and an upper package portion, the lower package portion having the high frequency device disposed therein. The substrate is disposed over the high frequency device, the upper package portion being disposed above the substrate. Input/output terminals for inputting/outputting signals to/from the package and the circuit on the substrate are connected, and the circuit on the substrate and the high frequency device are connected.

The high frequency device is preferably disposed at a ground potential and sealed by the package.

The input/output terminals of the package, the leads on the substrate, the input/output terminals of the high frequency devices may be connected directly or through bump bonds, lead electrodes or conductive adhesives.

Formed on the substrate are lumped constant circuits of inductive devices, capacitative devices or resistance devices. The inductive device is formed by photolithography or with coils. Power supply lines for the high frequency devices may be disposed on the substrate. If a plurality of high frequency devices is disposed within the package, connection leads between the high frequency devices may be disposed on the substrate. If the high frequency device is a surface acoustic wave device, the capacitive device may be provided in a piezoelectric substrate of the surface acoustic wave device.

Electrical connections between surface acoustic wave device chips, between active device chips such as GaAs FETs, or between terminals of a package or a circuit board and chips mounted thereon are made by circuits formed by a thin copper film on a flexible substrate such as a film tape to thereby dispose a matching circuit easily in the package.

At this time, the circuits on the substrate may be disposed floating within the package. Therefore, the circuits are separated from the ground potential of the package to thereby provide a preferable configuration as the circuit which handles high frequency signals.

At this time, the circuit formed in the film tape includes matching circuits for the surface acoustic wave devices and active devices or coils for tuning the surface acoustic wave resonator.

The circuit pattern in the film tape is formed with thin cupper films in a photolithographic process similar to the manufacture of semiconductor ICs, so that very fine matching circuits are realized without variations. In addition, the connection electrodes and matching circuits formed in the film tape can by themselves measure and evaluate the high frequency characteristic of the respective circuits. Therefore, the result of the evaluation can be used for design of the overall circuit to thereby render the device optimal and eliminate problems with the packaging. Building the matching circuits in the module achieves non-adjustment and miniaturization.

BRIEF DESCRIPTION OF THE DRAWINGS

FIG. 2a illustrates the conventional technique, while FIGS. 2b-2d illustrate hypothetical examples of a structure including the device shown in FIG. 2a.

DESCRIPTION OF THE PREFERRED EMBODIMENTS

Embodiments of the present invention will be described in more detail with reference to the drawings.
(Embodiment 1)

Figure 1A:
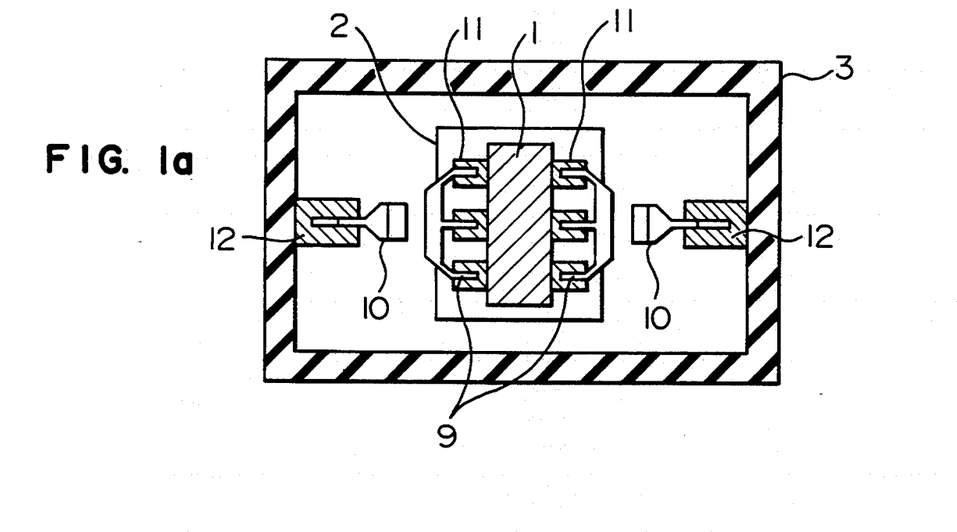
FIGS. 1a, 1b are a plan view and a cross-sectional view of an embodiment of the present invention.
Figure 1B:
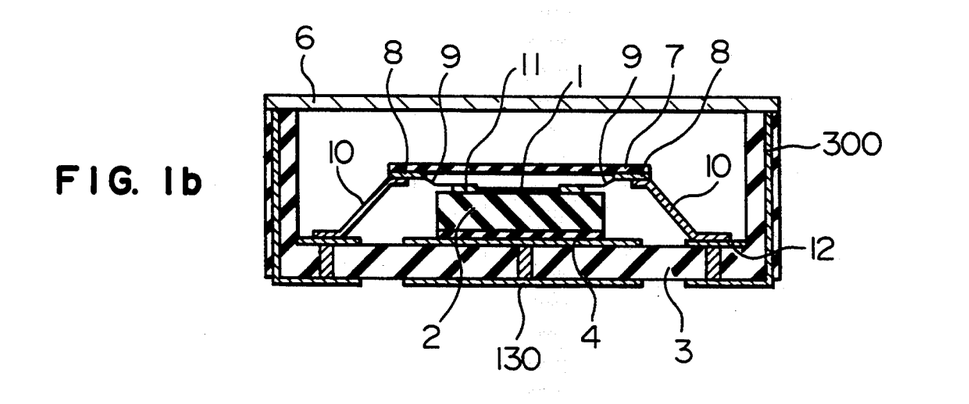

FIGS. 1a and 1b, showing an embodiment of the present invention, are a plan view and a cross-sectional view, respectively, of the embodiment.

As shown in FIGS. 1a and 1b, surface acoustic wave device chip 2 with a comb-type electrode 1 which generates a surface acoustic wave is fixed on a piezoelectric substrate surface within a package 3 with a bond 4 (FIG. 1b) and hermetically sealed with a cap 6 (FIG. 1b). The main portion of the package 3 is made of alumina or ceramics. The surface acoustic wave device 2 is placed on a ground potential layer 130.

Electrodes 8 are attached to a film tape 7, for example, of polyimide. Pads 11 of the surface acoustic wave device 2 and input/output terminals 12 of the package are connected by inner leads 9 and outer leads 10 through the film tape 7. FIG. 1a is a plan view of the module without the cap 6 and film tape 7. As will be described later in more detail, connection leads or matching circuits may be formed on the film tape 7. The surface acoustic wave device 2 which is a high frequency device is hermetically sealed with the cap 6 made of a metal such as iron and with a metal wall 300 (FIG. 1b) of the package.
(Embodiment 2)

Figure 10A:
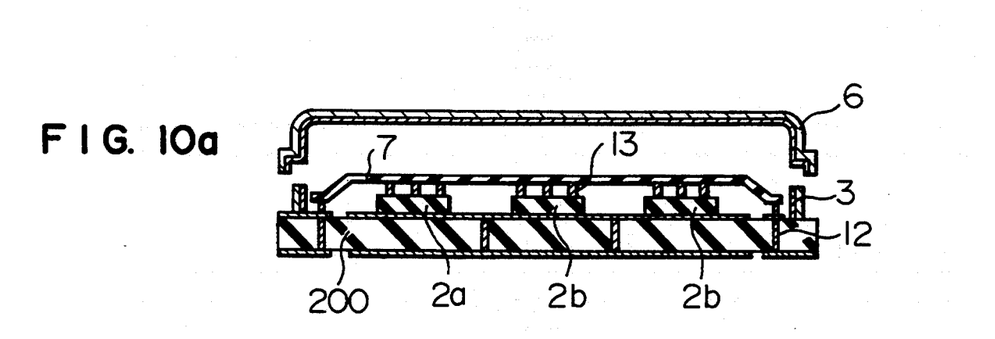
FIGS. 10a, 10b are respectively a cross-sectional view and a plan view of an embodiment of the present invention.
Figure 10B:
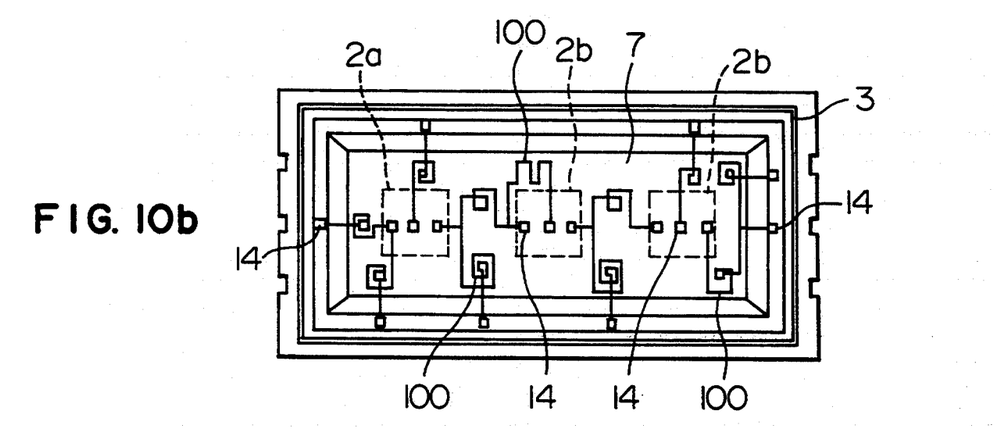

FIGS. 10a and 10b show a surface acoustic wave device 2a and active devices 2b such as ICs which are mounted on or die-bonded to the same package 3 or on a single substrate (a mother board of a radio device), the devices 2a and 2b and the input/output terminals 12 (FIG. 10a) of the package 3 being connected through a thin copper circuit formed in a single- or multi-layered film tape 7. Reference numeral 200 (FIG. 10a) denotes the main portion of a lower package portion made of alumina.

This embodiment illustrates the connection of the circuit formed in the film tape 7 and the devices 2a, 2b using bumps 13 (FIG. 10a) such as solder, which is recently marked greatly. FIG. 10a shows metal cap 6.

FIG. 10b is a plan view of the module of FIG. 10a without the cap 6. The film tape 7 is provided with a matching circuit for a surface acoustic wave device, a matching circuit for active devices and a power supply circuit formed in a thin copper film pattern 100. Pads 14 are formed for connection with the devices 2a, 2b and the input/output terminals 12 of the package 3.

Figure 11A:
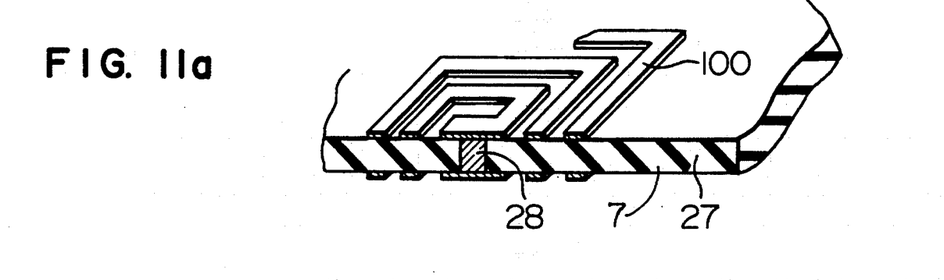
FIGS. 11a, 11b are respectively perspective view of the FIGS. 1 and 10 embodiments.
Figure 11B:
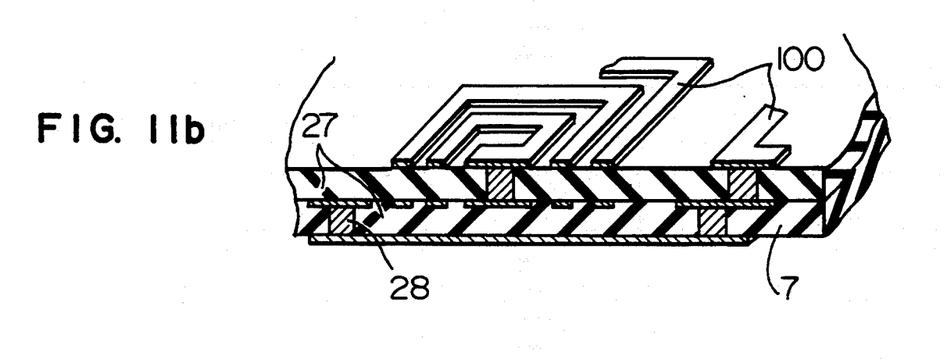

FIGS. 11a and 11b are respectively enlarged views of the film tapes 7 shown in FIGS. 1a and 10b. A single- or a multi-layered circuit pattern 100 is formed with a thin copper film on a film 27, for example, made of polyimide to thereby form either a spiral or a meander line-like inductance, a gap or a capacitance involving parallel plates, a thin film or a thick film resistor and/or, as required, a chip part. FIG. 11a shows a structure of a single film layer while FIG. 11b shows a two-layered film structure. Connection between the opposite surfaces of the film or between circuit patterns on the films are made through holes 28 formed in the films. FIGS. 11a and 11b illustrate a coil used for the matching circuit. In the embodiment of FIGS. 11a and 11b, the film 27 is about 50–500 μm thick, and the copper leads 100 are 5–200 μm thick and 5–200 μm broad.

(Embodiment 3)

Figure 3A:
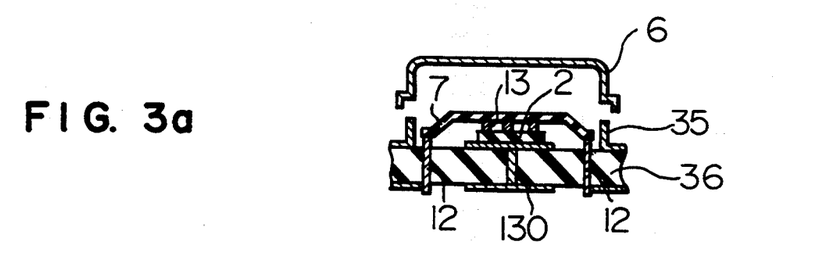
FIGS. 3a-3c are respectively a cross-sectional view and plan views of an embodiment of the present invention.
Figure 3B:
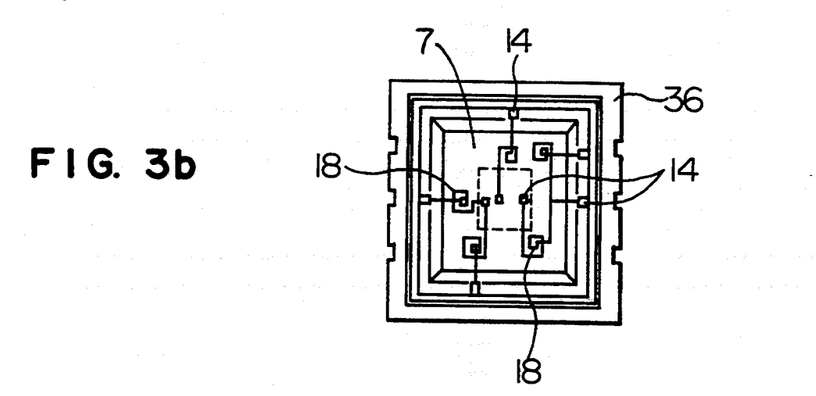
Figure 3C:
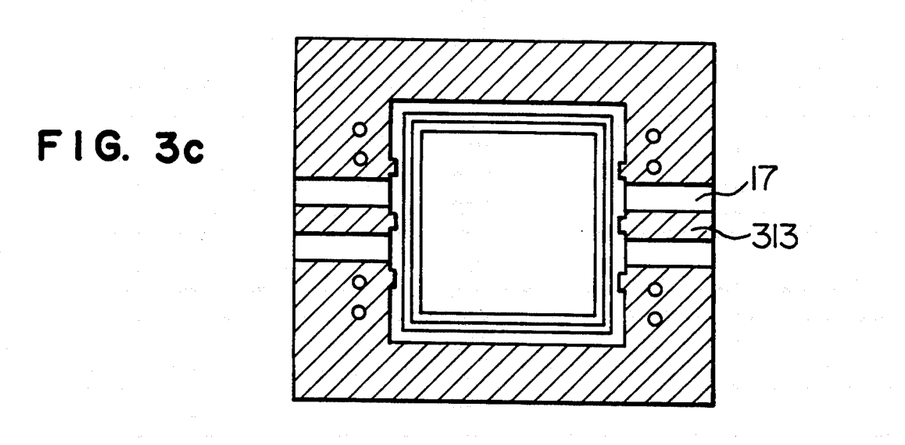

FIGS. 3a, 3b and 3c show a die-bonding method by the present invention corresponding to the conventional die-bonding method shown in FIGS. 2a–2d. A surface acoustic wave device chip 2 is mounted on a ground potential layer 130 in a ceramics-based flat package 36 such as that shown in FIG. 3a. Formed on the film tape 7 as shown in FIG. 3b is a wiring conductor pattern including matching circuits 18, package 36, and connection pads 14 for the device 2. The device 2 and the input/output terminals 12 of the package 36 are connected by bumps 13 (FIG. 3a) through the film tape 7. Simultaneously, impedance matching between an external load and the devices is achieved.

Hermetic sealing is achieved by attaching a metal cap 6, for example, made of iron, to a protrusion 35 on the package by current welding or with a bond as in the conventional manner (FIG. 3a). The cap 6, protrusion 35 are clamped to a ground potential. The surface acoustic wave device 2, thus attached, has the matching circuit within the package, so that no external matching circuits are required or greatly reduced in number. As shown in FIG. 3c, the surface acoustic wave device of such construction can be directly mounted on or die-bonded to a circuit substrate (mother board) 17 with a microstrip line 313 having, for example, a characteristic impedance of 50 ohms.

In the present invention, the input/output terminals 12 (FIG. 3c) used for attaching the package 3 are not required to extend through the mother board 17, as are the terminals of the conventional device of FIG. 2b due to the package 3 being mounted or die-bonded, and no external matching circuits are required. Thus, die-bonding of the embodiment to the device is very easy. The mother board 17 is required to be processed only on one circuit surface even when the package is attached over the mother board to thereby improve the assembly efficiency.

More particularly, in the configuration of FIGS. 2a–2d, both the upper and lower surfaces of the mother board are required to be used. The overall area of a 800 MHz-band car telephone module additionally including the external matching circuits is, for example, about 12 mm×12 mm. In contrast, in the present invention of FIGS. 3a–3c only one surface of the mother board is needed. In addition, in the car telephone sets, the module is miniaturized to a size of about 2.5 mm×2.5 mm which is the size of the surface acoustic wave device chip.

Figure 12:
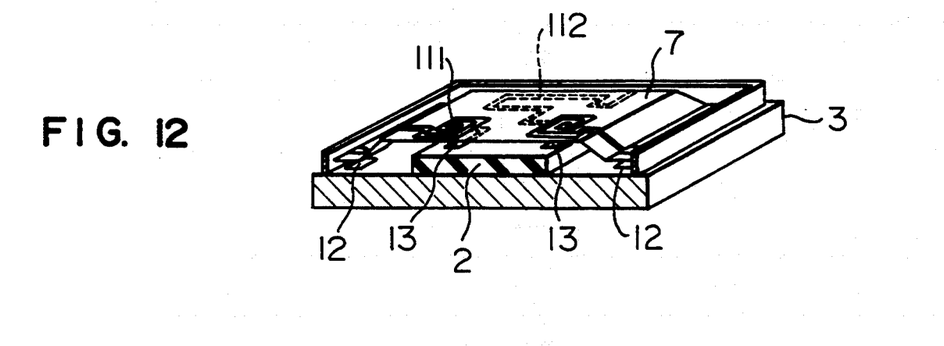
FIG. 12 is a perspective view of an embodiment of the present invention.

FIG. 12 illustrates the actual matching circuit in a perspective view obtained by further specifying the structure of FIGS. 3a, 3b. The film tape 7 is disposed over the surface acoustic wave device 2 die-bonded within the package 3 with a spacing between the device 2 and film tape 7. The film tape 7 has the spiral or meander line-like matching circuit 111 and connection leads for the device 2 and package input/output terminals 12. The solid lines show leads on the front of the film tape 7 while the broken lines 112 show leads on the back surface of the tape 7.

(Embodiment 4)

Figure 4A:
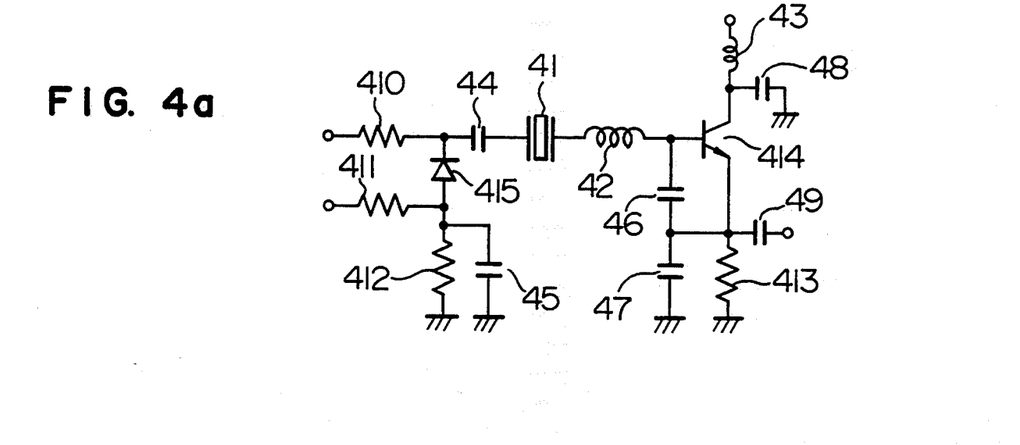
FIGS. 4a, 4b are respectively a circuit diagram and a graph explaining the embodiment.

Another embodiment will be described with respect to a specified circuit. FIG. 4a shows an equivalent circuit of a voltage controlled oscillator (VCO), one or two of which are necessarily used in a mobile radio terminal.

In using a resonator such as a conventional dielectric material resonator or microstrip line as a VCO, the drawback is increased size. The use of a surface acoustic wave resonator 41 serves to miniaturize the module. Generally, a VCO of surface acoustic wave type resonator is narrow in variable frequency width and it is difficult to ensure all the frequency band widths used in car telephone sets.

Figure 4B:
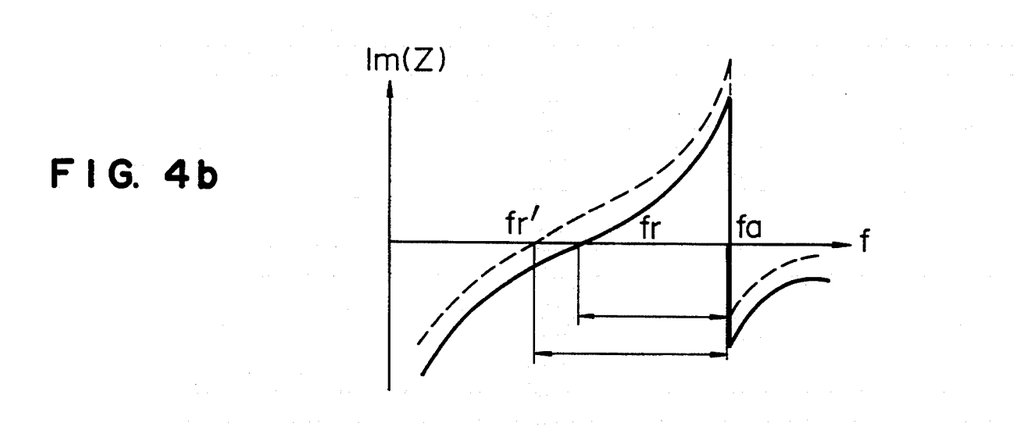

Such a drawback with the surface acoustic wave resonator is eliminated by the connection of an inductance (coil) 42 of a relatively small value, for example, of 5–10 nH in series or parallel with the surface acoustic wave resonator as shown in FIG. 4a. The impedance characteristic of the surface acoustic wave resonator has a value shown by the solid line in FIG. 4b. Incorporation of such a resonator into an oscillator results in oscillation in a frequency region (between fr and fa) where the impedance is inductive. Therefore, in order to broaden a variable frequency width, it is required to either lower the resonant frequency fr or increase an anti-resonance frequency fa. For example, as shown in FIG. 4a, series connection of an inductance 42 with the resonator causes the impedance to change as shown by the broken lines in FIG. 4b. That is, fa-fr' is broader than fa-fr. Thus, when the resonator is built in an oscillator, the variable frequency width of the VCO is broadened. As an example, fr=850 MHz, fa=900 MHz and fr'=820 MHz.

The value of such an extension inductance must be determined with high accuracy.

The value of the inductance formed in a film tape, for example, of polyimide or glass epoxy using a single- or multi-layered copper film, as described above, can be controlled with high accuracy. As shown in FIG. 4a, the VCO also includes a power supply coil 43. The input/output terminals or the power source terminals are also required to be connected to external devices. The formation of these elements in the film tape as in FIG. 1b serves to reduce variations of inductances in the modules and to achieve miniaturization.

Generally, a VCO requires capacitors 44, 46 and 47 for forming either a Colpits or a Hartley oscillator and capacitors 45, 48 and 49. In the present embodiment, part or all of these capacitors are realized by a gap structure or a dielectric multilayered structure in a surface acoustic wave resonator chip. Generally, the piezoelectric substrate used for a surface acoustic wave device has a very large relative dielectric constant and a capacitance ranging from several pF to tens of pF can be easily formed in the chip. The simultaneous formation of these capacitances in the same process as that for forming the surface acoustic wave resonator miniaturizes the overall circuitry and simplifies the process. Such a technique is disclosed, for example, in Japanese Patent Publication JP-A 63-132515 (U.S. Pat. No. 4,803,449).

The VCO circuit of FIG. 4a uses many active devices such as a transistor 414 and many resistors 410, 411, 412 and 413. Generally, the resistors can easily be formed in an active device chip when the active device is formed as are many semiconductor ICs. Also shown is a diode 415.

AVCO of a single package structure, for example, shown in FIGS. 10a-10b, is realized on the basis of the study of the above description. In FIGS. 10a-10b, the surface acoustic wave resonator and part or all of capacitance components are formed in the surface acoustic wave device chip 2a, and active devices such as transistors and part or all of the resistance components are formed in the semiconductor device chip 2b. Connections for the inductance (coil), input/output terminals and power supply terminals are formed with a thin copper film formed on the film tape 7. By such construction, the surface acoustic wave resonator 2a and semiconductor 2b are basically formed as respective chips. By bonding the film tape with bumps 13 shown on top of the chip and input/output terminals, a microminiaturized VCO which is miniaturized to the chip level is achieved. Such VCO has an area slightly larger than the sum of the areas of a surface acoustic wave resonator chip (about 2 mm×2 mm) and a semiconductor device chip (about 1 mm×1 mm) and has a height substantially equal to that of the chip (about 0.4 mm). AVCO which has a reduced volume is achieved even when die-bonded to a flat package, as shown in FIGS. 1a-1b.

(Embodiment 5)

Figure 5:
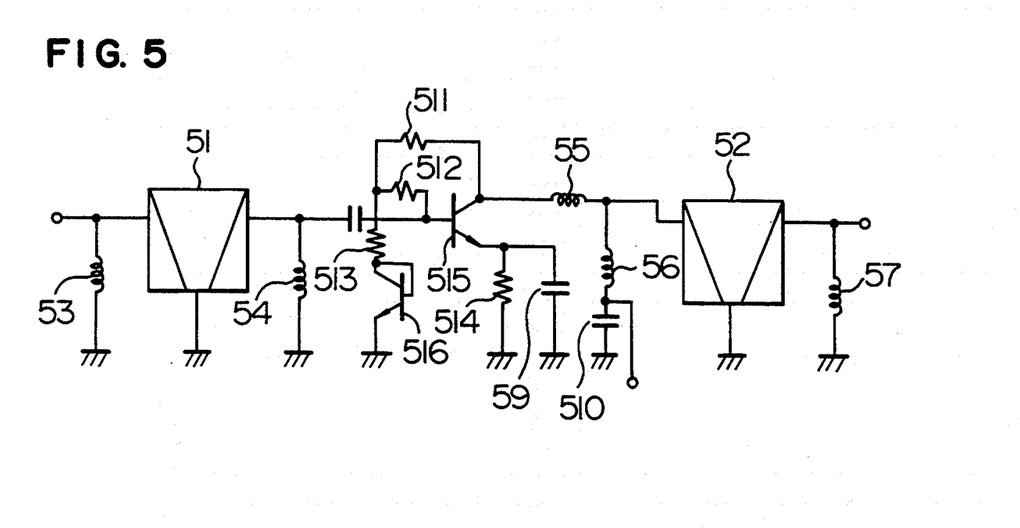
FIG. 5 is a circuit diagram indicative of an embodiment of the present invention.

FIG. 5 shows an embodiment of another circuit producing larger effects by application of the present invention. It also shows the front end unit of a radio receiver of a car telephone set. A signal received through an antenna terminal (not shown) enters a surface acoustic wave filter 51 of the first stage of the receiver, which provides a signal in a reception band and attenuates unnecessary signals, i.e., as spurious ones. Since generally the use of only the first stage filter is insufficient to attenuate useless signals completely, a further surface acoustic wave filter 52 is used in the next stage through a low noise amplifier 515 to ensure a required quantity of attenuation.

A direct current bias is required in each of the low noise amplifier and a mixer. It is applied across a separate power supply terminal and ground.

The overall front end unit including the input/output terminals, surface acoustic wave filter 52, low noise amplifier 515, and power supply terminals is shown in FIG. 5. Also shown are capacitors 59 and 510, resistors 511–514 and transistor 516. A mixer (not shown) is connected to the output of the front end unit of FIG. 5. The front end unit can include a mixer.

The surface acoustic wave filter requires external inductances 53, 54, 56, 57, for example, of 50–100 nH, to cancel inter-electrode capacitances of the transducer. In the low noise amplifier, the semiconductor devices as the active ones and, as mentioned above, the resistors can relatively easily be formed as monolithic ones while capacitances having a large value, for example, of 50–100 pH and matching inductances, for example, of 10–20 nH are difficult to form as monolithic ones.

The present invention solves these problems. As in the VCO of FIGS. 4a–4b, the matching inductances for the surfaces acoustic wave filter and low noise amplifier are formed with a thin copper film on the film tape, etc. Capacitors having an especially large value are formed in the form of a gap capacitance in the surface acoustic wave filter chip. The semiconductor devices and resistors are formed in the semiconductor chip. Two surface acoustic wave filters and one semiconductor IC chip are connected to each other by a thin copper film circuit formed on the film tape using bump techniques, as shown in FIGS. 1a–1b. When provided in the package, the input/output terminals and power supply terminals for the package can be connected simultaneously through the film tape. Therefore, the overall volume is substantially the same as the sum of the volumes of three chips including two filter chips and one IC chip. According to this embodiment, great miniaturization is achieved compared to the conventional techniques including the steps of providing a surface acoustic wave filter hermetically sealed within a can type package on a mother board of a radio device, using external matching circuits in the input/output units, and forming a low noise amplifier in a similar circuit type. Even if there is a mixer, etc., at the next stage of the FIG. 5 module, larger scale integration including the formation of a mixer can be achieved using a similar technique.

That is, the present embodiment can be constituted as one package device, as shown in FIGS. 10a–10b. The film tape 7 advantageously has a small parasitic capacitance because it is isolated from each of the upper and lower ground level layers through a space.

The present invention has been described above using the specified circuit of the radio device. While in the various embodiments the connection between the surface acoustic wave device and the semiconductor chips and the connection between the devices, chips and the terminals through the film tapes using bump techniques have been illustrated on the basis of the module of FIGS. 1a–1b, the connection using bump techniques is not necessarily required.

(Embodiment 6)

Figure 6A:
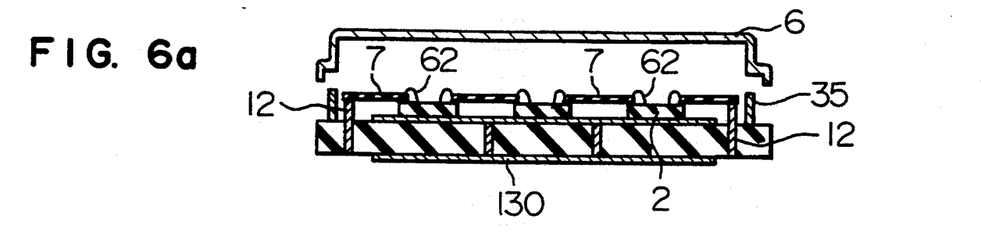
FIGS. 6a-6e are a cross-sectional view, a plan view and fragmentary cross-sectional views of embodiments of the present invention.
Figure 6B:
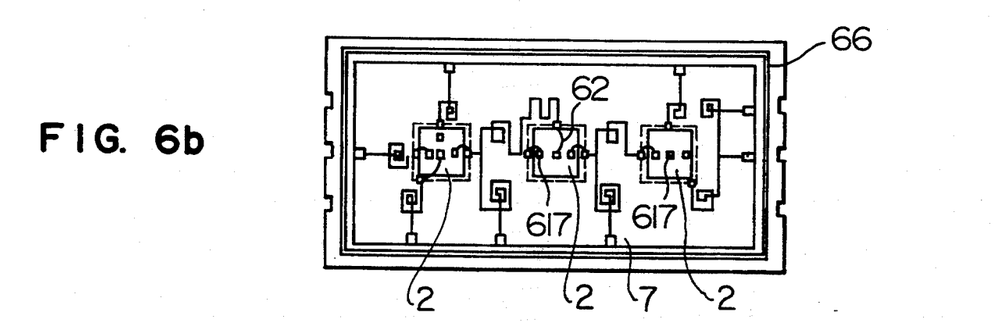

As an example of simpler connection, a chip 2 and a film tape 7 can be connected by bonding at 62 as in the conventional techniques, as shown in FIGS. 6a and 6b. In addition, many connection methods could be considered. Various connections between the film tape and, for example, the package input/output terminals could be considered.

Figure 6C:
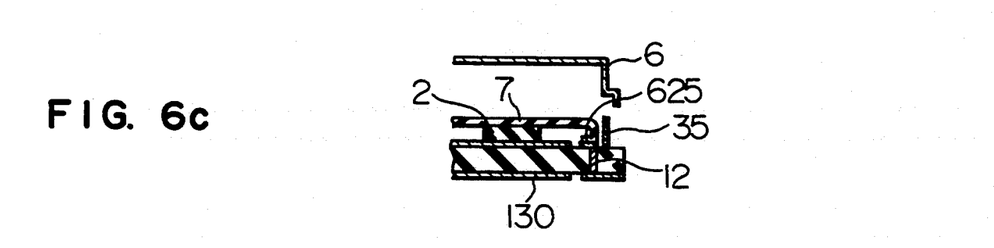
Figure 6D:
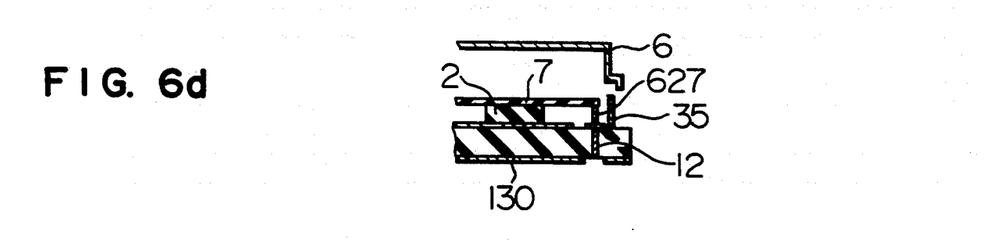
Figure 6E:
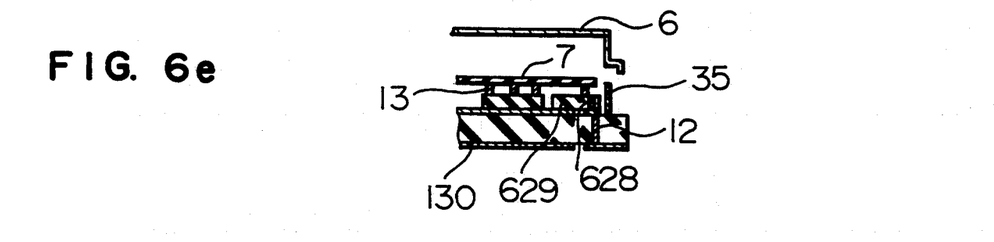

Several examples are shown in FIGS. 6c, 6d and 6e. FIG. 6c shows a technique of connecting the package and a bent film tape 7 with a conductive adhesive 625. FIG. 6d shows a technique of forming a post-like conductor 627 on the package and connecting the conductor and the film tape. FIG. 6e shows the technique of forming a dummy chip 629 having substantially the same height as a surface acoustic wave device or a semiconductor IC chip so as to cover the package terminals, and connecting the device or chips and the dummy chip through a through hole 628 in the dummy chip 629. As described above, the present invention uses a substrate of a flexible material, so that the degree of freedom of providing devices is very high. Also shown, as in FIG. 3a, is a metal cap 6 and protrusion 35.

(Embodiment 7)

The above embodiments have the structures in which the surface acoustic wave device, semiconductor IC chips are connected through the circuitry formed on the film tape or the like, and the resulting assembly is attached to the flat package or the like. The flat package is the one which has no terminals extending through the mother board and on which the devices or the like can be provided. When miniaturization of a radio device terminal is strictly required, temporary provision of the devices in the package, and provision of the package on the mother board of the radio device or the like would increase inefficiently used space, and the number of steps of die-bonding the devices, which is not necessarily an advantageous method.

Figure 7:
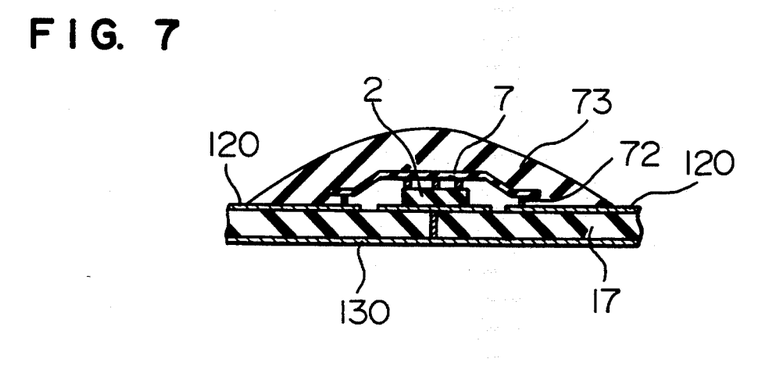
FIG. 7 is a cross-sectional view of an embodiment of the present invention.

FIG. 7 shows one example of a die-bonding method of solving the above problems. A surface acoustic wave device 2 and semiconductor ICs are directly die-bonded to the mother board 17 of a radio device and connection is made through the film tape 7 between the devices including circuits on the mother board 17 or between the input/output terminals 72 and/or input/output lines 120 and the devices. In such die-bonding, the overall area of the mother board occupied by the devices is substantially equal to that by the chips, so that the devices are die-bonded in a very small area. FIG. 7 further shows the overall module covered with a mold 73 such as silicone rubber or resist in consideration of the passivation of the devices.

(Embodiment 8)

Figure 8:
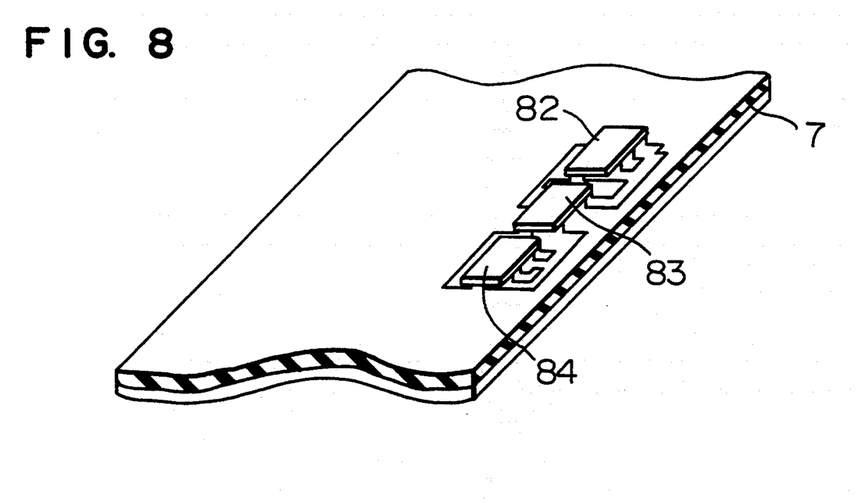
FIG. 8 is a perspective view of an embodiment of the present invention.

FIG. 8 shows another embodiment solving similar problems. This embodiment is the same as the above embodiments in that the surface acoustic wave devices or semiconductor ICs 82, 83, 84 are connected through a film tape, but differs in that the film tape has a function similar to that of the mother board of the radio device to thereby greatly reduce the volume occupied by the devices. A multi-layered film tape circuit is die-bonded in the radio device terminal by the use of the flexibility of the film tape 7. Passivation may be performed with a molding material such as a resin as in FIG. 7.

(Embodiment 9)

In the above embodiments, we proposed a die-bonding method of connecting the surface acoustic wave devices and semiconductor ICs through the thin copper film circuit formed on the film tape. Thus, substantial miniaturization is achieved compared to the conventional die-bonding techniques. A matching circuit of a multilayered structure is formable with a thin copper film on the film tape or the like, as shown in FIGS. 11a and 11b.

Figure 9A:
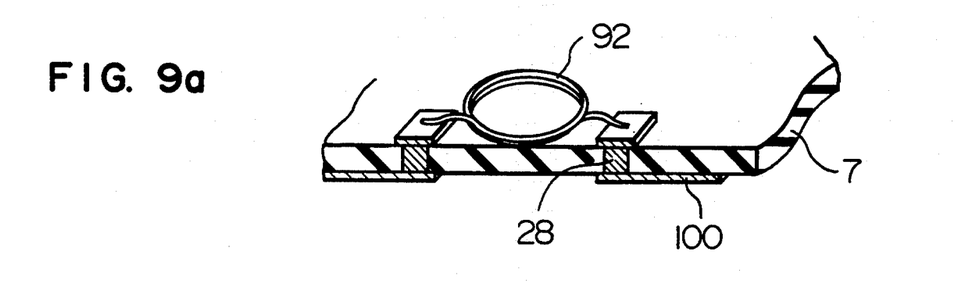
FIGS. 9a-9d are perspective views of embodiments of the present inventions.
Figure 9B:
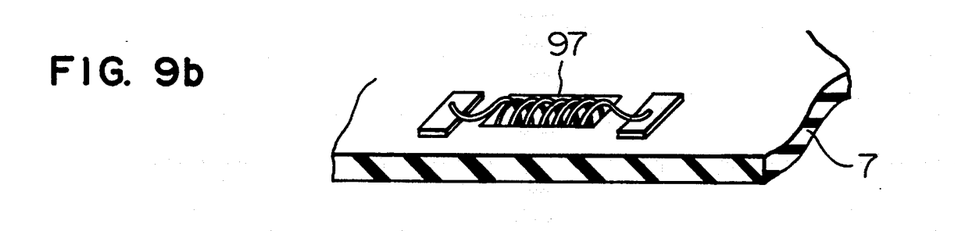
Figure 9C:
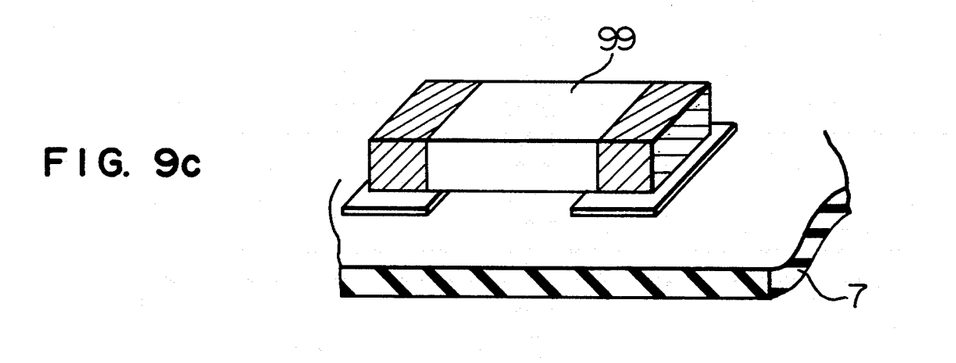
Figure 9D:
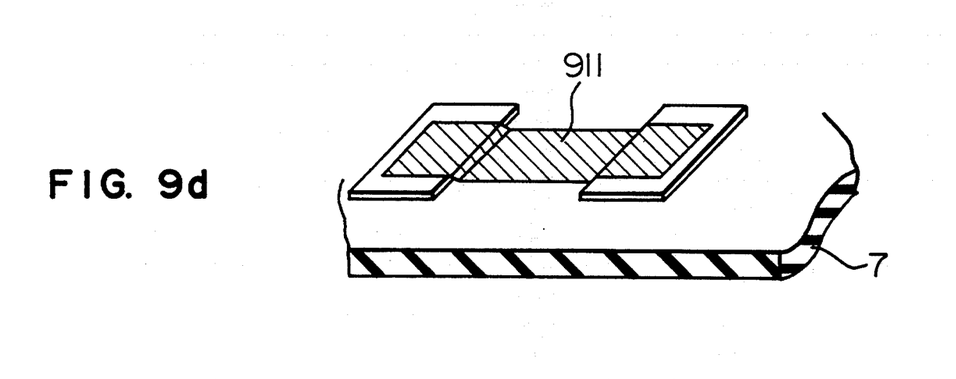

In addition to the matching circuit, lumped constant inductances 92, 97 of thin copper or gold coils 92, 97 as respectively shown in FIGS. 9a, 9b; a chip capacitor 99 of a laminated dielectric film of FIG. 9c; and circuit elements such as a thick or thin resistor 911 of FIG. 9d are formable. The thick or thin film resistors are formed by the printing of a resistor material. While the above embodiments are described using the film tapes, a similar die-bonding method is achieved if a fine circuit pattern is formable and a substrate flexible to some degree is used. The present invention includes those packaging methods. In the above description, like elements are identified with like reference numerals and characters.

In mobile radio communication devices, the surface acoustic wave devices are said to contribute most to miniaturization, but have many problems to be solved in terms of performance and die-bonding. Thus, the surface acoustic wave devices are not used very prevalently. Especially, in the prior art, the hermetically sealed devices are conventionally die-bonded to the mother board of a radio device and external matching inductances are provided, so that the total occupied volume is not greatly reduced, and the merits of miniaturizing the surface acoustic wave devices are half reduced by one half. The present invention solves these problems. According to the present invention, a surface acoustic wave device is provided which is miniaturized to a chip level by the formation of a required matching circuit on a multi-layered film tape of polyimide or the like, and the connection of the surface acoustic wave device chip and the film tape using bump techniques. The present invention produces large advantageous effects not only in the surface acoustic wave devices, but also in semiconductor ICs or for the combination of the wave devices and the ICs.

We claim:

1. A high frequency module comprising:
    a package comprising a first package portion having first terminals and a second package portion;
    a high frequency device having second terminals; and,
    a flexible substrate having wiring conductor patterns thereon including at least one of a distributed constant circuit and a lumped constant circuit;
    said first package portion having said high frequency device disposed therein;
    said flexible substrate with said at least one of said distributed constant circuit and lumped constant circuit being disposed above said high frequency device;
    said second package portion being disposed above said flexible substrate with said at least one of said distributed constant circuit and lumped constant circuit; and,
    said flexible substrate being of bent shape such that said wiring conductor patterns contact said first terminals of said first package portion and said second terminals of said high frequency device and said wiring conductor patterns on said flexible substrate being electrically connected such that said at least one of said distributed constant circuit and said lumped constant circuit performs impedance matching or transformation for said high frequency device.

2. The high frequency module according to claim 1, wherein the second terminals of said high frequency device and said wiring conductor patterns on said flexible substrate are electrically connected through a bump electrode.

3. The high frequency module according to claim 1, wherein said distributed constant circuit is a multilayered structure including copper film.

4. The high frequency module according to claim 1, further comprising a seal between the first and second package portions.

5. The high frequency module according to claim 1 wherein said high frequency device is a surface acoustic wave device further comprising a capacitor on a piezoelectric substrate, said high frequency module further comprises a second high frequency device, said second high frequency device including a semiconductor device having third terminals, and further wherein the first terminals of said package, the second terminals of said surface acoustic wave device, the third terminals of the semiconductor device and the wiring conductor patterns on said flexible substrate are electrically connected to each other such that said at least one of said distributed constant circuit and lumped constant circuit performs impedance matching for said surface acoustic wave device and semiconductor device, said surface acoustic wave device, said semiconductor device and said capacitor constituting an oscillation circuit.

6. A high frequency module comprising:
a package comprising a first package portion having first terminals and a second package portion;
a high frequency device having second terminals; and,
a flexible substrate having wiring conductor patterns including at least one of a distributed constant circuit and a lumped constant circuit;
said first package portion having said high frequency device disposed therein;
said flexible substrate with said at least one of said distributed constant circuit and lumped constant circuit being disposed above said high frequency device;
said second package portion being disposed above said flexible substrate with said at least one of said distributed constant circuit and lumped constant circuit; and,
said first terminals of said first package portion being connected to post-like conductors to provide contact with said wiring conductor patterns on said flexible substrate said second terminals of said high frequency device and said wiring conductor patterns on said flexible substrate being electrically connected, such that said at least one of said distributed constant circuit and lumped constant circuit performs impedance matching or transformation for said high frequency device.

7. The high frequency module according to claim 6, wherein said high frequency device is a surface acoustic wave device further comprising a capacitor on a piezoelectric substrate, said high frequency module further comprises a second high frequency device, said second high frequency device including a semiconductor device having third terminals, and further wherein the first terminals of said package, the second terminals of said surface acoustic wave device, the third terminals of the semiconductor device and the wiring conductor patterns on said flexible substrate are electrically connected to each other such that said at least one of said distributed constant circuit and lumped constant circuit performs impedance matching for said surface acoustic wave device and semiconductor device, the electrical connection of said surface acoustic wave device, said semiconductor device and said capacitor constituting an oscillation circuit.

8. The high frequency module according to claim 6, wherein the second terminals of said high frequency device and said wiring conductor patterns on said flexible substrate are electrically connected through a bump electrode.

9. The high frequency module according to claim 6, further comprising a seal between the first and second package portions.

10. The high frequency module according to claim 6, wherein said distributed constant circuit is a multilayered structure including copper film.

11. A high frequency module comprising:
a package comprising a first package portion having first terminals and a second package portion;
a high frequency device having second terminals; and,
a flexible substrate having a wiring conductor pattern including at least one of a distributed constant circuit and a lumped constant circuit;
said first package portion having said high frequency device disposed therein;
said flexible substrate with said at least one of said distributed constant circuit and lumped constant circuit being disposed above said high frequency device;
said second package portion being disposed above said flexible substrate with said at least one of said distributed constant circuit and lumped constant circuit; and,
dummy chips substantially flush with said high frequency device being disposed on said first terminals of said first package portion to provide contact between a conductor disposed on a surface of each of said dummy chips and the wiring conductor pattern disposed on said flexible substrate and said second terminals of said high frequency device and said wiring conductor pattern on said flexible substrate being electrically connected such that said at least one of said distributed constant circuit and lumped constant circuit performs impedance matching or transformation for said high frequency device.

12. The high frequency module according to claim 11, further comprising a seal between the first and second package portions.

13. The high frequency module according to claim 11, wherein the second terminals of said high frequency device and said wiring conductor patterns on said flexible substrate are electrically connected through a bump electrode.

14. The high frequency module according to claim 11, wherein said distributed constant circuit is a multilayered structure including copper film.

15. The high frequency module according to claim 11, wherein said high frequency device is a surface acoustic wave device further comprising a capacitor on a piezoelectric substrate, said high frequency module further comprises a second high frequency device, said second high frequency device including a semiconductor device having third terminals, and further wherein the first terminals of said package, the second terminals of said surface acoustic wave device, the third terminals of the semiconductor device and the wiring conductor patterns on said flexible substrate are electrically connected to each other such that said at least one of said distributed constant circuit and lumped constant circuit performs impedance matching for said surface acoustic wave device and semiconductor device, the electrical connection of said surface acoustic wave device, said semiconductor device and said capacitor constituting an oscillation circuit.

16. A radio communication device comprising:
a package comprising a first package portion having first terminals and a second package portion;
a high frequency device having second terminals; and,
a flexible substrate having wiring conductor patterns including at least one of a distributed constant circuit and a lumped constant circuit;
said first package portion having said high frequency device disposed therein;
said flexible substrate with said at least one of said distributed constant circuit and lumped constant circuit being disposed above said high frequency device;
said second package portion being disposed above said flexible substrate with said at least one of said distributed constant circuit and lumped constant circuit; and, said first terminals of said first package portion being connected to post-like conductors to provide contact with said wiring conductor patterns on said flexible substrate and said second terminals of said high frequency device and said wiring conductor patterns on said flexible substrate being electrically connected such that said at least one of said distributed constant circuit and lumped constant circuit performs impedance matching or transformation for said high frequency device.

17. The radio communication device according to claim 16, wherein the second terminals of said high frequency device and said wiring conductor patterns on said flexible substrate are electrically connected through a bump electrode.

18. A radio communication device comprising:
a package comprising a first package portion having first terminals and a second package portion;
a high frequency device having second terminals; and,
a flexible substrate having a wiring conductor pattern including at least one of a distributed constant circuit and a lumped constant circuit;
said first package portion having said high frequency device disposed therein;
said flexible substrate with said at least one of said distributed constant circuit and lumped constant circuit being disposed above said high frequency device;
said second package portion being disposed above said flexible substrate with said at least one of said distributed constant circuit and lumped constant circuit; and,
dummy chips substantially flush with said high frequency device being disposed on said first terminals of said first package portion to provide contact between a conductor disposed on a surface of each of said dummy chips and the wiring conductor pattern disposed on said flexible substrate and said second terminals of said high frequency device and said wiring conductor pattern on said flexible substrate being electrically connected such that said at least one of said distributed constant circuit and lumped constant circuit performs impedance matching or transformation for said high frequency device.

19. The radio communication device according to claim 18, wherein the second terminals of said high frequency device and said wiring conductor patterns on said flexible substrate are electrically connected through a bump electrode.

20. A radio communication device comprising:
a package comprising a first package portion having first terminals and a second package portion;
a high frequency device having second terminals; and,
a flexible substrate having wiring conductor patterns thereon including at least one of a distributed constant circuit and a lumped constant circuit;
said first package portion having said high frequency device disposed therein;
said flexible substrate with said at least one of said distributed constant circuit and lumped constant circuit being disposed above said high frequency device;
said second package portion being disposed above said flexible substrate with said at least one of said distributed constant circuit and lumped constant circuit; and,
said flexible substrate being of a bent shape such that said wiring conductor patterns contact said first terminals of said first package portion and said second terminals of said high frequency device and said wiring conductor patterns on said flexible substrate being electrically connected such that said at least one of said distributed constant circuit and said lumped constant circuit performs impedance matching or transformation for said high frequency device.

21. The radio communication device according to claim 20, wherein the second terminals of the electrical connection of said high frequency device and said wiring conductor patterns on said flexible substrate are electrically connected through a bump electrode.

* * * * *